United States Patent [19]

Dan et al.

[11] Patent Number: 5,038,711
[45] Date of Patent: Aug. 13, 1991

[54] EPITAXIAL FACILITY

[75] Inventors: Jean-Pierre Dan, Malvaglia-Chiesa; Eros De Boni, Giornico; Peter Frey, Ascona; Johann Ifanger, Ronco s/Ascona, all of Switzerland

[73] Assignee: Sitesa S.A., Biasca, Switzerland

[21] Appl. No.: 274,805

[22] PCT Filed: Mar. 10, 1988

[86] PCT No.: PCT/EP88/00188
§ 371 Date: Jan. 5, 1989
§ 102(e) Date: Jan. 5, 1989

[87] PCT Pub. No.: WO88/07096
PCT Pub. Date: Sep. 22, 1988

[30] Foreign Application Priority Data

Mar. 10, 1987 [DE] Fed. Rep. of Germany ....... 3707672

[51] Int. Cl.$^5$ .............................................. C23C 16/00
[52] U.S. Cl. ..................................... 118/715; 118/668; 118/671; 118/676; 118/679; 118/724; 118/728; 118/730
[58] Field of Search ............... 118/668, 671, 676, 679, 118/707, 715, 724, 725, 728, 729, 730, 733; 294/64.1, 86.4; 414/416; 901/31, 40

[56] References Cited

U.S. PATENT DOCUMENTS

| | | | |
|---|---|---|---|
| 3,603,284 | 9/1971 | Garnasche | 118/725 |
| 3,641,974 | 2/1972 | Yamada et al. | 118/730 |
| 4,322,592 | 3/1982 | Martin | 118/730 |
| 4,389,970 | 6/1983 | Edgerton | 118/725 |
| 4,446,817 | 5/1984 | Crawley | 118/725 |
| 4,579,080 | 4/1986 | Martin et al. | 118/725 |
| 4,632,060 | 12/1986 | Goto et al. | 118/715 |
| 4,638,762 | 1/1987 | Kim et al. | 118/730 |
| 4,715,637 | 12/1987 | Hosoda et al. | 294/86.4 |
| 4,720,130 | 1/1988 | Andou | 294/64.1 |

FOREIGN PATENT DOCUMENTS 85397 8/1983 European Pat. Off. .
147967 7/1985 European Pat. Off. .

(List continue on next page.)

OTHER PUBLICATIONS

Tandon, J. L. and Y. C. M. Yeh, "Large-Scale Growth of GaAs, Epitaxial Layers by Metal Organic Chemical Vapor Deposition", J. Electrochem. Soc., vol. 132, No. 3 (Mar. 1985), pp. 662–668.

Logar, R. and J. Borland, "Silicon Epitaxial Processing Techniques for Ultra-Low Defect Densities," Solid State Technology, vol. 28, No. 6 (Jun. 1985), pp. 133|136.

Kreh, J. G., "Technique to Deposit Thick Films Without Warping or Breaking Wafer", IBM Technical Disclosure Bulletin, vol. 7, No. 12 (May 1965), p. 1119.

Primary Examiner—Shrive Beck
Assistant Examiner—Terry J. Owens
Attorney, Agent, or Firm—Fish & Richardson

[57] ABSTRACT

An epitaxial facility with at least one reaction chamber made of dielectric material, comprising a gas inlet in the ceiling area and a gas outlet in the floor area, a gas mixer connected to the gas inlet of the reaction chamber for the infeed of reaction and scavenging gases, a polyhedral support made of graphite, which is mounted so as to be able to rotate in the reaction chamber between the gas inlet and the gas outlet and tapers toward the gas inlet, for accommodating a number of wafers, and induction heating system essentially surrounding the reaction chamber for indirect heating of the wafer support. The epitaxial facility further comprises a device for transferring the wafer support from a charging zone outside of the reaction chamber to a working position inside the reaction chamber, a device for charging the wafer support with wafers in the charging zone, and a clean-air space accommodating the facility components. With the use of scavenging and reaction gases from the gas mixer through the reaction chamber when the wafer support is in the working position, and of pure air and protective gases in the clean-air space when the wafer support is in the charging zone, and between the charging zone and the working position within the reaction chamber, particles entrained by the gases and particles arising in the epitaxial process are kept away from the surface of the wafer support.

17 Claims, 6 Drawing Sheets

FOREIGN PATENT DOCUMENTS

| | | |
|---|---|---|
| 3204436 | 8/1983 | Fed. Rep. of Germany . |
| 3639991 | 6/1987 | Fed. Rep. of Germany ...... 414/416 |
| 49-15356 | 4/1974 | Japan .................................. 118/715 |
| 59-207622 | 11/1984 | Japan .................................. 118/730 |
| 61-87319 | 5/1986 | Japan .................................. 118/728 |
| 61-94053 | 5/1986 | Japan .................................. 118/728 |
| 61-222221 | 10/1986 | Japan .................................. 118/728 |
| 61-267330 | 11/1986 | Japan .................................. 118/730 |
| 61-273441 | 12/1986 | Japan .................................. 414/416 |
| 2171978 | 9/1986 | United Kingdom ................ 414/416 |

EPITAXIAL FACILITY

BACKGROUND OF THE INVENTION

The invention relates to an epitaxial facility for applying semiconductor layers to semiconductor wafers in accordance with the epitaxial process.

With this type of facility or plant, as is generally known, flawless layers of pure silicon, for example, in perfect crystalline array and/or alternatively silicon layers with p-type or n-type conductivity can be applied epitaxially to a suitable substrate, in this case silicon. Such layers form, so to speak, the skeleton of highly integrated circuits. The basic materials used for these perfect crystalline layers are so-called high-purity, and in this case silicon-containing, processing gases, to which traces of p- or n-type doping agents may be added, such as arsenic compounds or phosphorus compounds. The silicon and dopants are deposited on the surface of wafers in the reaction chamber by means of the CVD method. The wafers are inserted in indentations of the support made of graphite coated with silicon carbide, which is heated to a temperature of approximately 1050° C. The support is also referred to as a susceptor. The wafers are thin plates, sliced parallel to the lattice plane of a single crystal of silicon, which have a perfect surface structure whose grid precisely matches the lattice constant. This surface structure forces the silicon atoms precipitated out of the gas phase onto the wafer into the perfect crystalline order required for making semiconductor layers.

The process which has just been briefly outlined for the manufacture of semiconductor starting material by means of gas-phase epitaxy requires highly advanced technology both for heating of the wafer support and for controlling the flow of the processing and scavenging gases. It will be readily understood that the charging and discharging of the wafer support with its sensitive, thin wafers, which take place outside of the reaction chamber, must be carried out under conditions of highly purified air in a specially prepared space in the epitaxial facility. The most recent developments in this area are directed toward handling the wafers and loading the wafer support into the reaction chamber by remote control, without any direct intervention by operators.

To be sure, known plants of the type mentioned above for carrying out gas-phase epitaxy have already been successfully set up for the manufacture of semiconductor starting material; nevertheless, they can still be improved in many respects. Thus, the efficiency of the hitherto used induction heating systems and their tolerability for operating personnel both need improvement. With respect to the remote control of the epitaxial facility mentioned above, improvements still remain to be made in the areas of user friendliness, fully automatic charging and discharging of wafer supports and control routines whereby malfunctions arising in the course of processing can be dealt with. Of primary concern here are the safety of operating personnel in the event of malfunctions and the protection of wafers that are already partially coated.

The most pressing problem still to be solved in gas-phase epitaxy under industrial mass-production conditions, however, relates to the ever increasing requirements in terms of coating quality, which still leaves something to be desired in the case of known plants of the initially mentioned type, due to undesirable particles that are either present in the facility or produced during the process of epitaxial growth. One of the chief problems here is that these unwanted foreign particles can get onto the surface of the wafer and thus interfere with the desired crystalline arrangement as epitaxial layers form.

SUMMARY OF THE INVENTION

The present invention is therefore aimed at improving epitaxial plants of the species described above, while maintaining their present advantages to a very large extent, and, in particular, at increasing the evenness and purity of the epitaxial layer.

This is achieved by providing an epitaxial facility, according to the species, with means for ensuring the wafer against contact with undesirable foreign substances.

A particular feature of the invention is that all the gas streams in the facility are controlled in such a way that undesirable microscopic particles are kept away from the surface of the support and consequently from the surface of the wafers to be coated as a function of the position in which the wafer support is placed, i.e., in the working position within the reaction chamber or outside of it in the charging zone or in a position between the charging zone and placement inside the reaction chamber.

In what follows, the advantages which can be achieved with the invention must first be illustrated in connection with the transfer of the wafer support between its position within the reaction chamber and the charging zone. Simply for the sake of illustration, reference will be made to a substantially bell-shaped reaction chamber with a wafer support in the form of a truncated pyramid which, together with the floor of the chamber, can be transferred to the charging zone by means of a special device. Wafer supports of this type, in the form of a polyhedron flattened on the ends, are in themselves known and exhibit on their faces slanting indentations in the surface to accommodate wafers. The feeding of the bell-shaped reaction chamber with processing and scavenging gases takes place from the top of the chamber and these gases are removed in the chamber base area.

Now, in order to keep undesirable foreign bodies in the form of tiny microscopic particles away from the wafer surfaces to be coated when charging the wafer support and also when transferring the wafer support from the charging zone to the reaction chamber and vice versa, the invention calls for surrounding the wafer support, both when being transported between its working position and the charging zone and during its temporary stay in the charging zone, with a laminar protective gas stream, which in the case of a wafer support in the form of a truncated pyramid preferably flows around it in the vertical direction from the tapered upper end to the broadened lower end and in this way effectively prevents any residual particles in the surrounding pure-air atmosphere from getting on the surface of the support and, consequently, on the wafers. The protective gas flow must therefore be made essentially laminar, in order to prevent the creation of any turbulence in the vicinity of the wafer support whereby particles from the environment might be conveyed to the surface of the support.

It is advantageous for the flow of the pure-air atmosphere to be adapted in terms of direction to the flow of protective gas, at least in the area of the charging zone;

i.e., in the case of a vertical downward-directed laminar protective gas stream, the clean air surrounding this laminar flow jacket should also run vertically from top to bottom, and thus substantially parallel to the stream of protective gas.

In accordance with an advantageous refinement of the invention, the laminar protective gas stream is created with the scavenging gas, which is fed into the reaction chamber through the gas mixer. This guarantees a protective gas jacket for the wafer support starting from the exit of the support from the reaction chamber, the device for transferring the wafer support from the working position in the reaction chamber to the charging position preferably being a lift operated exclusively in the vertical direction, so that the laminar air stream created by the gas inlet to the reaction chamber always provides a sufficient encircling air jacket for the wafer support, which thus takes up its charging position directly beneath the reaction chamber.

In order to create, with certainty, laminar conditions for the protective stream in the upper area of the frustum-shaped wafer support as well, it is advantageous to provide, on the upper base of this support, a cap that is favorably shaped from the standpoint of fluid mechanics. In accordance with an advantageous refinement, such support cap has a base portion in the shape of a truncated pyramid, whose lateral surface merges without any seam with the lateral surface of the wafer support, while the upper section of the cap opposite the gas inlet to the reaction chamber has the shape of a segment of a sphere.

A support cap thus advantageously designed from the standpoint of fluid mechanics additionally supports the desired flow in the reaction chamber in the upper reaches between the inner wall of the chamber and the wafer support while in its working position during epitaxial growth. In that position the support cap favorably designed from the standpoint of fluid mechanics cooperates advantageously with a gas inlet designed in accordance with the invention as a gas diffuser.

Aside from favorable flow, a further advantage of the gas diffuser resides in the fact that the scavenging and reaction gases are equally distributed over the surface of the wafer support, so that all the wafers placed on the support are equally confronted with the same processing gas atmosphere, a situation which advantageously contributes to even coating of the wafer surfaces.

Taking into consideration the bell-shaped reaction chamber and the support in the shape of a truncated pyramid, the part of the gas diffuser located opposite the support is designed in the form of a circular disk. The disk extends substantially parallel to the upper base of the truncated-pyramid-shaped support and comprises radial gas outlets which are distributed about the perimeter of the disk. The disk-shaped part of the gas diffuser is shaped in its peripheral area in such a way as to promote favorable flow conditions and advantageously comprises a conical, widening lower rim area so as to pass the flow of gases emerging from the periphery of the diffuser to the support cap in a turbulence-free manner. For this purpose the gas diffuser, which runs coaxially with the common longitudinal axis of the support and the reaction chamber, is adjustable in the direction parallel to that axis. Owing to this axial adjustability, the diffuser can be placed without any problem in the optimum position, from the standpoint of flow dynamics, with respect to the support and the inner wall of the chamber.

An advantageous contribution to the favorable, and in particular turbulence-free, flow profile that is sought, in accordance with the invention, in the upper part of the reaction chamber is also made by a circular shield, which has substantially the diameter of the gas inlet neck of the reaction chamber and thus to a large extent closes off the neck opening in terms of flow. In addition, the gas inlet neck is closed in the known manner with a flange in its outside end area.

Further measures for conducting the flow in accordance with the invention relate to the shaping of the edges of the wafer support and the shaping of the support base. For this purpose the longitudinal edges of the polyhedral wafer support—which is driven rotationally in epitaxial operation—are designed, in accordance with the invention, in such a way as to promote favorable flow conditions, i.e., flattened or rounded. As a further measure relating to flow mechanics, the support is equipped at its base with a pedestal that tapers toward the gas outlet in the chamber floor; this pedestal, in accordance with an advantageous refinement, is also in the form of a frustum of a pyramid and the larger base of this truncated pyramid is connected flush with the underside of the support. As in the case of the support, all the edges of the support pedestal are flattened or, preferably, rounded. The lower base of the pedestal, which is advantageously made of graphite, is connected to the rotary drive of the wafer support.

Particles which are entrained inside the reaction chamber by the gas stream but kept away from the surfaces of the wafers by the flow pattern chosen in accordance with the invention accumulate in the area of the support pedestal, both on the wall of the pedestal itself and on the chamber floor. The latter comprises openings through which the gases are removed from reaction chamber. In order to prevent such particles which have accumulated in the pedestal area from getting onto the surfaces of any wafers that have been partially coated—in the case of an interruption of the epitaxial operation owing to some disturbance, for example—the particles collected in the area of the support pedestal are enclosed there in accordance with the invention in such a way that they cannot get into either the clean-air space or the annular space between the support in its working position and the walls of the reaction chamber even in the event that the wafer support is transferred in accordance with specifications to the charging zone and, after being charged afresh, back into the reaction chamber. The device provided for retaining the particles in the area of the support pedestal is a ring insert which is made, for example, of quartz, extends substantially up the total height of the pedestal and sits tightly on the floor of the reaction chamber adjacent to the area of the inner wall of the chamber. The gas outlets provided in the floor of the chamber within the annular space are located between the inner wall of the ring insert and the outer wall of the pedestal. As an additional means for retaining the particles, the invention calls for the formation, below the chamber floor and contiguous to it, of a particle trap in the form of an annular space largely closed on all sides which closes off the annular space toward the interior of the chamber. Due to suction, the particles accumulated in the pedestal area proceed through the outlets in the chamber floor into the annular channel that serves as a particle trap, owing to the fact that the gases introduced into the chamber are removed via the floor of the annular channel.

The lifting platform of the vertical lift for the wafer support is connected to the annular channel. It is advantageous for the rotating drive to be housed in the lifting platform. The rotating drive extends through the annular channel which serves as a particle trap and engages on the underside of the support pedestal.

In accordance with an advantageous further development, the lifting platform comprises on its rim a device for the non-tilting, precise-fitting, tight coupling of a chamber floor structure to a sealing flange connected to the base of the chamber. For this purpose the coupling device advantageously comprises three fastening members in the form of elbow levers disposed at intervals of approximately 120° around the circular chamber floor structure and the sealing flange. These engage with the chamber floor structure as soon as the vertical lift has moved this system into the immediate vicinity of the chamber sealing flange, effect the remaining vertical lift of the chamber floor structure, with tight-fitting guidance over inclined planes formed both on the sealing flange and on the chamber floor structure, and secure the two parts to be connected together in their final position.

As can be inferred from the foregoing remarks, the directing of flow in accordance with the invention with view to keeping the wafer surfaces free of foreign particles is also influenced by the shape of the wafer support. Now, in order to make sure that in the daily use of the epitaxial facility the proper wafer support intended, according to specifications, for use with a particular reaction chamber is always employed, the wafer support is marked, in accordance with the invention, preferably in such a way that the marking can be read by a peripheral of a process control computer. The process control computer preferably controls and monitors all the functions of the epitaxial facility. The support identification serves as a measure of quality assurance. With a view to making the latter largely invincible in practical on-site operation, in accordance with the invention the support identification is encoded in such a way that it can be decoded by a decoding device during epitaxial operation or immediately prior to the introduction of the epitaxial reaction gases, i.e., with an already heated wafer support. For this purpose it is advantageous to make the introduction of the epitaxial reaction gases dependent on the recognition of a wafer support in accordance with specifications.

In accordance with an advantageous refinement of the support code, such code consists in the creation of areas of different thickness in the support walls, the different thermal absorption of which is detected by a pyrometer and transmitted to the decoding device.

For remote-control operation, and especially for epitaxial facility operation controlled by a process control computer, in accordance with the invention a manipulator for charging the wafer support with wafers is provided, set up within the charging zone in the neighborhood of the wafer-support charging position in such a way that within its range of operation there is also a wafer store that serves as a storage bin for fresh, unloaded wafers and for the gathering of wafers loaded in the reaction chamber. In order not to affect adversely the flow of the stream controlled in accordance with the invention within the clean-air space in whose charging zone the manipulator is set up and operates by remote control, and thus, in other words, in order not to transfer particles entrained in the gas stream to the surface of the wafers to be coated owing to movements of the manipulator, especially in the immediate vicinity of the wafer store and the wafer support, provision is made, in accordance with the invention, for the movement of the manipulator to be adapted to the flow of the surrounding gases. Thus, the invention calls for restriction of the freedom of movement of the manipulator, with a view to undisturbed vertical flow of the pure air and laminar flow of the protective gas in the area of the charging zone, to essentially vertical manipulator movements. Such restriction of the freedom of movement of the manipulator can advantageously be supported by control of manipulator speeds. In order to keep particles produced due to wearing of the manipulator itself out of the gas stream it is preferred, as a flanking measure, to enclose the manipulator in a flexible dust-protection covering.

Any conventional type of manipulator is suitable for use in the clean space. It is particularly advantageous, however, to use a robot arm controlled by the process control computer. A manipulator or robot arm of this type advantageously comprises a grabbing member with two fingers designed to be adjustable essentially along a common axis and to rotate jointly about the rim of the wafer. In accordance with an advantageous development of this manipulator, the grabbing member is equipped with an optical detector for detecting a mark on the edge of the wafer, especially the straight edge section on the wafer. This detector cooperates with the finger control in such a way that the wafers are always grasped on their arc-shaped rim. An advantage of the optical detector lies in the fact that the wafers will always be set into the wafer indentations on the wafer support with the same orientation, for example with the straight edge section pointing up. In this way, at any time after the wafer has been loaded, when it is subjected to further processing, it can be ascertained in which direction the wafer surfaces were swept with the processing gas inside the reaction chamber.

To ensure frictionless charging of the indentations in the support with wafers and discharging, by means of the two-finger grabbing member, the indentations in the support are each provided, in their rim area, with two diagonally opposite recesses. These are dimensioned in such a way as to accommodate the fingers of the manipulator grabbing member when they grasp the wafers. The fingers advantageously comprise in their grasping area V-shaped notches whose angle of opening guarantees secure grasping of the wafers on the wafer edge.

A further advantageous embodiment of the manipulator calls for a further grabbing member comprising a suction cup whereby wafers placed in the storage bin can safely be picked up by their rear surface.

In conventional wafer supports in the form of truncated pyramids, the indentations for accommodating the wafers have a cylindrical recess extending out from the insertion surface, to which there is connected toward the inside an indentation part in the form of a segment of a spherical shell. The cylindrical indentation section provides adequate securing of the wafers within the indentations and has a depth that is approximately the same as the thickness of the wafer. The indentation section in the form of a segment of a spherical shell takes into account temperature gradients in the area of the support wall when the support is heated up. A drawback with this arrangement of the indentations in the wafer support is the considerable difference in thickness of the material of the indentations, especially in the area of the rim. This disadvantage is eliminated in accordance with the invention by having the segment-of-spherical-shell form of the indentations merge in an essentially continuous manner with the outer surface of the wafer support, i.e., without the formation of any supporting lip for the wafers. It is advantageous to have the brackets that support the wafers inserted in these indentations consist of two support points placed at a distance from one another on a horizontal line, provided in the lower region of each wafer indentation. In lieu of this two-point bracket, a horizontal crosspiece can also be provided. Surprisingly, thanks to this measure, the coating dissymmetries which otherwise occur at the edges of the wafers are diminished.

A considerable contribution toward a stream that is as particle-free as possible is provided by the gas mixer designed in accordance with the invention, which consists essentially of a main gas line to which there are connected in register fashion a plurality of branch lines through which the supporting gas, reaction gas, protective gas and scavenging gas are transferred to the main line, one end of which is connected to the gas inlet into the reaction chamber. The introduction of the gases into the branch lines of this gas mixer takes place in order of technical purity and also corrosiveness of the gases used, in such a way that more impure and aggressive gases are fed on a priority basis into the branch lines situated closest to the gas inlet to the reaction chamber. As a result, the shortest possible lengths of pipe within the gas mixer are passed through by relatively impure gases, and thus relatively small sections of the conduit system can be attacked by corrosive gases. On the whole, this reduces to a minimum the release of particles owing to corrosive gas properties inside the gas mixer.

It is advantageous, therefore, to feed the supporting gas required for the epitaxial process, being the cleanest and least aggressive gas, into the gas mixer at the end of the main gas line away from the reaction chamber. Nitrogen, which is customarily used in epitaxial plants as a scavenging gas, should be fed to the gas mixer at the end of the main gas line close to the chamber, though it is not very corrosive and is relatively clean, since experience shows that nitrogen is handled fairly carelessly in day-to-day laboratory practice. Thus the danger definitely exists that, for example, instead of high-purity nitrogen, ordinary nitrogen might be connected up to the gas mixer. If nitrogen were hooked up to a branch line remote from the gas mixer outlet, this would result in serious contamination of the gas mixer lines.

For the computer-controlled and computer-monitored measurement of water and wafer-support temperature in the reaction chamber, use is advantageously made of a pyrometer with a measuring head connected to a fiber optic waveguide. This is positioned in a sliding fashion at a relatively short distance—approximately 20 cm—from the surface of the wafer support, outside of the induction heater and parallel to the longitudinal axis of the wafer support. The use of a fiber optic light guide makes it possible to position the temperature-sensitive part of the pyrometer at a sufficient distance from the induction heating. It is advantageous to use a pyrometer which is set to two wavelengths of the thermal radiation of the wafer support, with at least radiation with one of the wavelengths penetrating the dielectric wall of the reaction chamber, substantially without any loss of intensity, even when this wall has become coated on the inside to a given layer thickness with reaction products of the epitaxial process. In this way temperature control of the epitaxial reactor will be guaranteed under all operating conditions.

It is highly advantageous from the economic standpoint to operate, within the epitaxial facility, at least one more reaction chamber, set up the same as the already described reaction chamber and wafer support as far as connections, flows and operating techniques are concerned. In this way the epitaxial facility will ensure independent charging and discharging of the wafer supports by means of the remote-controlled or process-controlled manipulator. In a multiple-chamber system of this sort the gas mixer, both in itself and with respect to its positioning and its connections to the reaction chambers, is advantageously set up symmetrically, so as to create the same processing conditions, in terms of processing gases, at all times for all reaction chambers.

Originally, induction heating systems in epitaxial plants were fed by high-frequency generators, which have been operated in a frequency range of more than 100,000 Hz and at voltages of several thousand volts. Inasmuch as the efficiency of an HF-generator of this sort is relatively low, attempts were made to use generators with a frequency range of less than 10,000 Hz for the current supply for induction heating. In site of improved efficiency, these low-frequency generators did not stand the test, due to the fact that their frequencies are audible to the human ear and the noise disturbance issuing from these generators is intolerable to operating personnel, at least in relatively long operation. For this reason, the epitaxial facility in accordance with the invention comprises a generator for supplying the induction heating system or systems within a frequency range that does not result in noise disturbance for the operating personnel and is characterized by improved efficiency with respect to hitherto known generators. The operating range of this generator falls advantageously between 15 kHz and 100 kHz, and especially between 16 kHz and 25 kHz.

The computer control of the epitaxial facility in accordance with the invention, in dialogue with the operating personnel, ensures automated operation of the epitaxial process and, as already mentioned, of the charging of the wafer support. The dialogue between computer and user takes place advantageously through a color monitor on which, for the sake of greater clarity, only the present processes and conditions in the facility are shown, separately for each reaction chamber.

A particularly advantageous refinement of computer control provides for taking into account any malfunctions that might occur during the course of the epitaxial process, with malfunctions being weighted according to their significance to the epitaxial growth process and the protection of the operating personnel. Thus, graded measures in accord with the weighting determined are triggered by the computer in the further course of the process. The spectrum of measures provided for includes the extreme measure of emergency exit from the current process, as for example when gas leaks are detected. The leakage of hydrogen from the facility or the failure of the facility's power supply, in particular, represent a certain danger to the operating personnel. In such cases enveloping scavenging gas, especially nitrogen, is introduced into the reaction chamber through the gas mixer.

If the computer-aided monitoring system reports a facility malfunction after at least part of the specified coating has already been grown on the wafer, measures will be taken to save the coating by introducing a suitable gas into the reaction chamber.

If the malfunction detected proves to be reparable in the current epitaxial process, the measure called for is to halt the epitaxial process in the current stage or set it back one step, and immediately after the end of the malfunction, i.e., after the repair has been carried out, the epitaxial process is continued at the point where it broke off.

DESCRIPTION OF THE PREFERRED EMBODIMENTS

The invention will now be explained in greater detail with the help of the drawing, in which.

Figure 1:
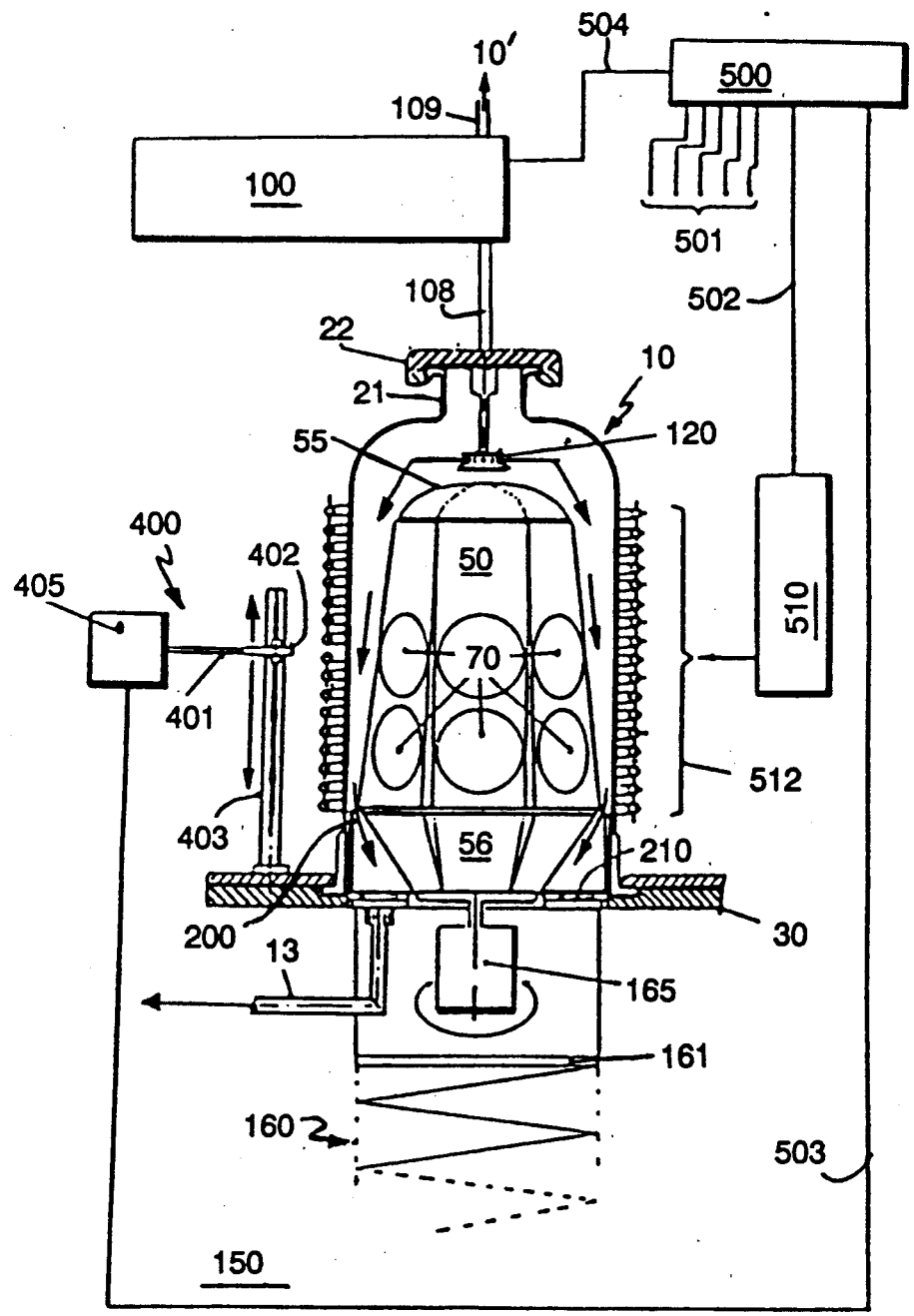
FIG. 1 is a schematic representation of an epitaxial facility in accordance with the invention.

FIG. 1 shows the arrangement, in principle, of the components of an epitaxial facility in accordance with the invention, comprising at least one reaction chamber 10. The required reaction gases for epitaxial coating of wafers 70 are fed into this reaction chamber 10 through a gas mixer 100, which is connected to the reaction chamber 10 via a line 108. Through a further connecting line 109 the gas mixer 100 is hooked up, in the embodiment shown, to a further reaction chamber 10' (not illustrated) of the epitaxial facility. The latter is substantially designed and controlled in the same way as the reaction chamber 10 illustrated in FIG. 1.

Through the gas mixer 100 other gases besides the reaction gases, such as supporting, scavenging and protective gases, are fed into the reaction chambers 10, 10' through the respective lines 108 and 109. The connecting line 108 opens into a gas diffuser 120, which is inserted into the sealing flange 22 of a gas inlet neck 21 of the reaction chamber 10. The gases delivered by the gas mixer 100 flow from the gas diffuser 120 into an annular space between a susceptor or wafer support 50 and the inner wall of the reaction chamber 10.

The wafer support 50, according to the embodiment illustrated, has the form of a truncated pyramid whose lateral surfaces are provided with a plurality of substantially circular recesses to accommodate wafers 70. The wafer support 50 in the form of a truncated pyramid is oriented coaxially with the longitudinal axis of the chamber and can be driven in rotation about the axis by means of a drive 165.

In order to promote the favorable flow of the gases, in particular without turbulence, in the reaction chamber 10, the upper, tapered end of the wafer support 50 in the form of a truncated pyramid is provided with a cap 55 and the broadening base, with a pedestal 56. The pedestal 56 is also in the form of a truncated pyramid and has substantially the same cross-sectional shape as the wafer support 50. Its tapered end, however, points toward the chamber base. The lateral surface of its other end runs flush into the lateral surface of the base area of the wafer support 50 in the form of a truncated pyramid.

The basal surface of the support cap 55 and the cross-sectional surface of the tapered end of the wafer support 50 are substantially shaped the same and of the same size. The lateral surface in the basal area of the support cap 55 merges without any seam with the lateral surface of the wafer support 50. The basal surface of the cap 55 evolves into a surface that is substantially spherical and arched upward and hence particularly favorable from the point of view of flow dynamics.

While the body of the wafer support 50 is made of graphite for particularly favorable thermal absorption, the pedestal 56 is advantageously made from an insulating material, such as quartz. In this way heat-sensitive parts, such as the drive mechanism 165, which are located in the base area of the reaction chamber 10 will be protected from the high operating temperature of the wafer support 50.

As will be explained in greater detail in what follows, devices, namely a ring insert 200 and a particle trap 210, for collecting particles developing during the epitaxial process and particles entrained by the gases are provided in the area of the support pedestal 56.

The heating of the wafers 70 arranged on the wafer support 50 to produce the necessary reaction temperature is done by an induction heating system. This consists essentially of a high-frequency generator 510 and a heating coil 512 supplied with current by the HF generator. The heating coil 512 surrounds the wall of the chamber 10, which wall is preferably made of quartz, creating a substantially cylindrical annular space. In the annular space between the reaction chamber wall 10 and the heating coil 512 a fluid, principally air, is introduced for the purpose of cooling the chamber wall.

In the area of the heating coil 512 a likewise essentially cylindrical reflector is formed, particularly in the form of metal strips, as basically known from German Patent 35 25 870 A1.

The high-frequency generator 510 works at an operating frequency that is higher than the threshold of perception of the human ear, i.e., essentially above 16 kHz, and in particular at 20 kHz.

The wafer temperature or the temperature of the wafer support 50 is monitored by means of a pyrometer 400 whose temperature-sensitive parts are placed in a housing 405 far from the induction heater 512. The pyrometer has a probe 402 placed in the neighborhood of the heating coil 512 and is connected to the evaluation optics within the housing 405 by means of a light guide 401, in particular a fiber optic waveguide. The probe 402 is placed on a stand 403 in such a way that its height can be adjusted, so as to be able to pick up, in any desired location, the temperature of the rotationally driven, heat-radiating wafer support 50 and the wafers disposed on it. Parallel to the adjusting course of the probe 402, openings are provided in the reflector of the induction heating coil 512, through which openings heat radiation from the interior of the reaction chamber reaches the probe 402 of the pyrometer essentially unattenuated.

The epitaxial facility further comprises an electronic control unit 500 with a process control computer. The electronic control unit 500 serves to control the entire epitaxial facility. Thus, for example, the heat values picked up by means of the pyrometer 400 are sent to the electronic control unit 500 via a line 503. The high-frequency generator 510 can be controlled by the electronic control unit 500 over another line 502. Other parameters of the epitaxial process, such as the gas pressure inside the chamber 10, are picked up by sensors connected to the control unit 500 via lines 501. The gas mixer 100 is also controlled by the control unit 500, through another line 504.

By means of the vertical lift 160, the wafer support 50 together with the floor structure of the reaction chamber 10, the particle collecting devices 200 and 210, the support drive unit 165, the gas outlet line 13 and other incoming and outgoing lines for cooling fluid, not shown in FIG. 1, can be transferred from the working position to the charging zone 150. The charging zone is set up in a clean-air space of the epitaxial facility, directly beneath the reaction chamber 10, which remains in its place.

Figure 2:
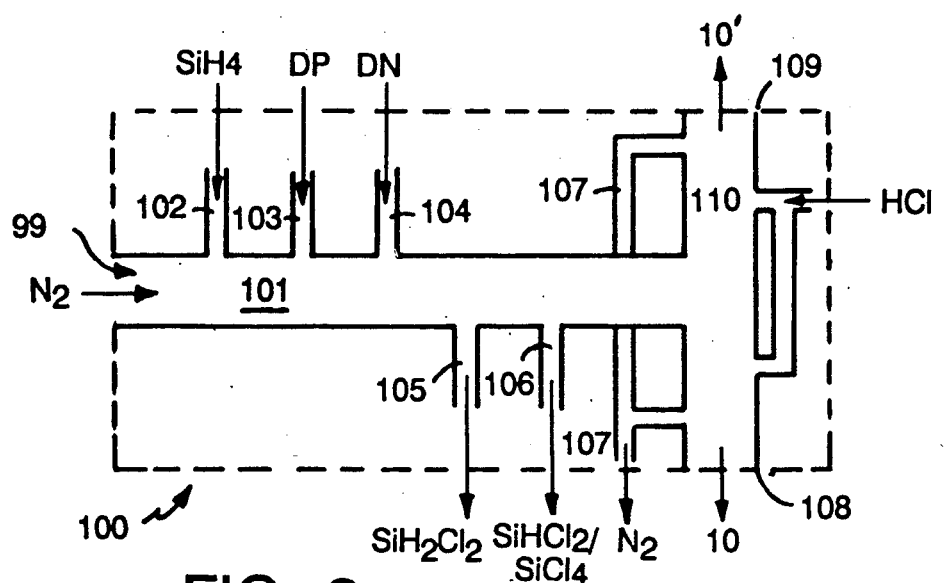
FIG. 2 is a schematic representation of the gas mixer used in the facility of FIG. 1.

The gas mixer employed in the epitaxial facility of FIG. 1 is shown schematically in FIG. 2.

The gas mixer 100 and the gases fed into it constitute, among other things, a source of foreign bodies whose presence is undesirable in the epitaxial process, in the form of small and extremely small particles. Though only gases of extremely high purity are used for the epitaxial process, those gases which contain chlorine compounds, in particular, are decidedly corrosive. They can attack the high-grade steel tubing of the gas mixer. The impurities thus given off by the tube walls are quite capable of interfering with the epitaxial process, especially the orderly growth of atoms on the wafer surfaces. Care must be taken, consequently, to keep the number of particles created due to corrosive gases inside the tubing system of the gas mixer 100 as small as possible. For this reason, the gas mixer 100 schematically illustrated in FIG. 2 is made up of a substantially straight main line 101, into which a plurality of branch lines 102 to 107 open in register fashion. Through these branch lines the different gases to be mixed with one another and then delivered to the reaction chambers 10 and 10' are fed in via the connecting lines 108 and 109. The infeed of the individual gases is graduated according to the aggressiveness of each one in such a way that the most corrosive gases are fed in near the mixer outlets to which connecting lines 108 and 109 are hooked up. In this way the more aggressive gases pass through a substantially shorter length of pipe inside the gas mixer 100 than the less aggressive, not to mention inert, gases.

Similarly, the supporting gas, chiefly nitrogen, required for the epitaxial process is introduced at the inlet 99 to the main line 101. To this, as it flows through the main line 101, there are added, in order, reaction gases of increasing aggressivity. Thus, for example, gaseous $SiH_4$ is fed in through a branch line 102 that comes after the inlet 99, followed by p-type dopant, such as $B_2H_6$ in the gaseous state. Proceeding downstream there follows the branch line 104, through which n-type dopant is added to the supporting gas in the main line 101. This is chiefly $PH_3$, $AsH_3$, both in gaseous form, or liquid $SbCl_5$. Next in order of increasing corrosiveness comes the infeed of a further gaseous silicon source, namely $SiH_2Cl_2$, through the branch line 105, followed by liquid $SiHCL_3$ or liquid $SiCl_4$, which are alternatively fed in through the branch line 106.

At the outlet end the main line 101 is branched in a T and ultimately opens into the connecting lines 108 or 109 to the two reaction chambers 10 and 10'. In that area of the main line, in other words as near as possible to the outlet area of the gas mixer 100, the extremely corrosive HCl gas is fed into the main line 101 via a two-armed branch line 110 that discharges at equal distances into the two T-shaped arm sections of the main line 101. In a similar manner, scavenging gas in the form of gaseous nitrogen is introduced into the T-shaped section of the main line 101 via a two-part branch line 107. For practical reasons, the nitrogen is not fed into the gas mixer 100 until the outlet area of the main line 101. Nitrogen, to be sure, is essentially inert with respect to the tubing material, but is used in laboratory practice in differing degrees of purity. The above measure is designed to prevent any nitrogen gas inadvertently introduced into the gas mixer 100 in a relatively impure form from contaminating the mixer over long stretches.

Figure 3:
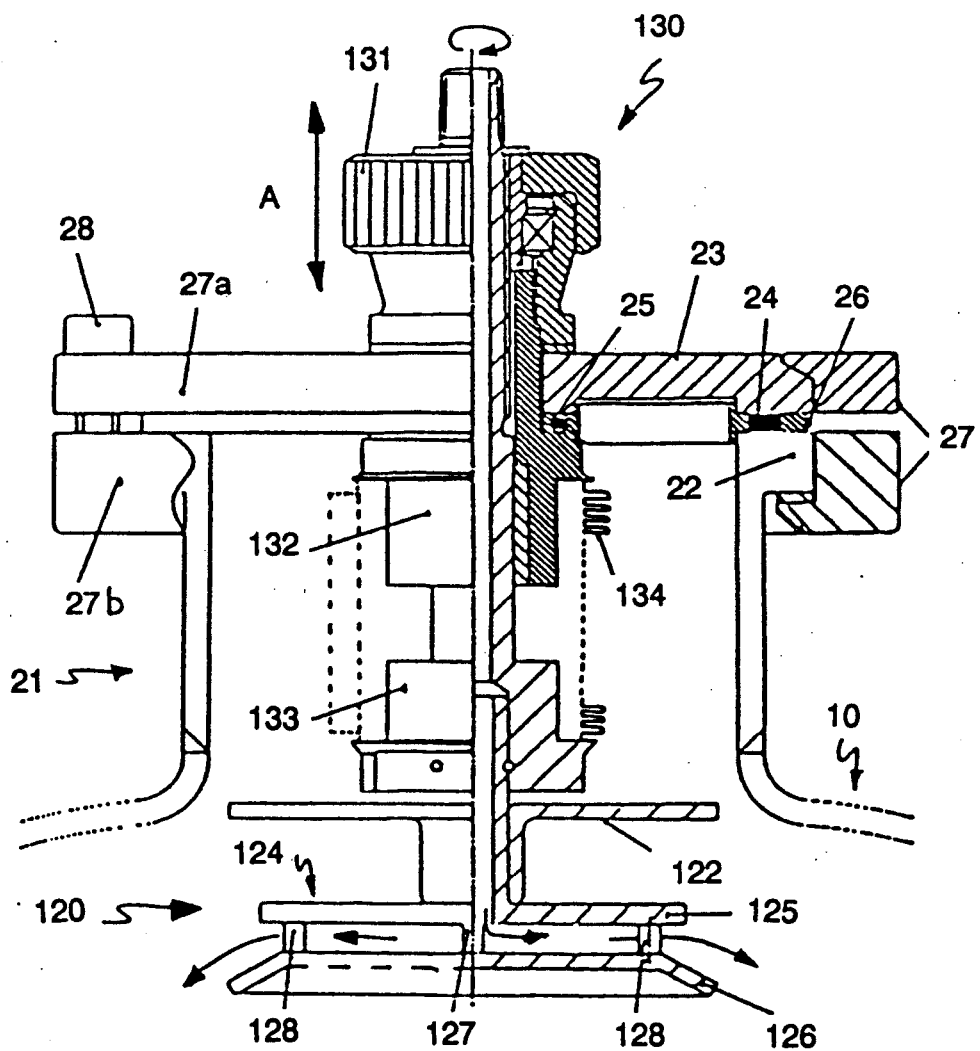
FIG. 3 is a view with partial cutaway of the gas diffuser placed in the gas inlet neck of the reaction chamber of FIG. 1.

FIG. 3 shows, in an enlarged, partially cut-away view, the gas inlet neck 21 of the bell-shaped reaction chamber 10 of FIG. 1. At its outer end the gas inlet neck 21 is provided with a flange 22 and closed off by means of a plate 23. A tight and durable fit of the closing plate 23 onto the top of the neck flange 22 is provided by a clamping device 27. This device comprises two rings 27a and 27b, of which one ring 27a clasps the conically bevelled upper edge of the closing plate 23 about its perimeter and the other ring 27b, the bottom edge of the neck flange 22. The two rings 27a and 27b are connected to each other and clamped together in a known manner by means of screws, of which only the screw 28 is shown in FIG. 3.

An adjusting mechanism 130 for the axial adjustment of the gas diffuser 120 is set into the closing plate 23. The mechanism 130 comprises a turning adjustment member 131 located outside of the reaction chamber 10; this adjustment member may be actuated either manually or, for example, by means of an electric motor. Inside the gas inlet neck 21 of the reaction chamber 10 the mechanism 130 comprises a guiding member 132 rigidly connected to the closing plate 23 and a member 133 which is adjustable in the axial direction (direction of the arrow A) and engages piston-like with the guiding member 132. With a view to preventing lubricant or grit created by the adjustment motion of the member 133 from getting into the reaction chamber 10, a bellows 134, made, for example, of sheet tombac, is inserted, tightly sealed, between the members 132, 133.

With view to ensuring that the adjusting axis of the adjusting mechanism 130 is in alignment with the longitudinal axis of the bell-shaped reaction chamber 10, a centering ring 26 is inserted between the closing plate 23 and the neck flange 22. The centering ring 26 also serves as a guide for an O-ring 24 which guarantees a tight seal between the closing plate 23 and the neck flange 22, as well as another O-ring 25 located further in, which makes a seal between the adjusting mechanism 130 and the closing plate 23.

The diffuser 120 connected, at the end of the adjusting mechanism 130 which is inside the chamber, to the member 133 of that mechanism comprises two plate-shaped structures 122 and 124. Connected directly to the member 133 is a round, disk-shaped part 122 with which the actual reaction space of the chamber 10 is uncoupled from the gas inlet neck 21 in terms of flow. Connected thereto, opposite the support cap 55, is the actual diffuser in the form of a disk-shaped structure 124. This structure 124 consists of a ceiling part 125 placed opposite the disk-shaped part 122 and a floor part 126 located at a distance from the ceiling part. The floor and ceiling parts 125, 126 are connected together by a central pin 127 and a plurality of pins 128 fixed on the peripheries of both parts.

The reaction, scavenging and protective gases are fed through an inlet opening, not shown, in the upper area of the adjusting mechanism into a channel running centrally through the mechanism and are discharged between the ceiling part 125 and the floor part 126 of the diffuser 120 into the inner space of the reaction chamber 10, following a flow profile that is represented by the arrow in the neighborhood of the gas diffuser 120. In the vicinity of the gas diffuser 120 and between the diffuser and the support cap 55 this profile is essentially bell-shaped, the campanular flow being favored by the conically sloping rim of the floor part 126 of the diffuser 120. The preferred material for the diffuser 120 is quartz.

The height adjustment of the diffuser 120 permits favorable adaptation of the flow profile to the flow space available for the gases.

Figure 4:
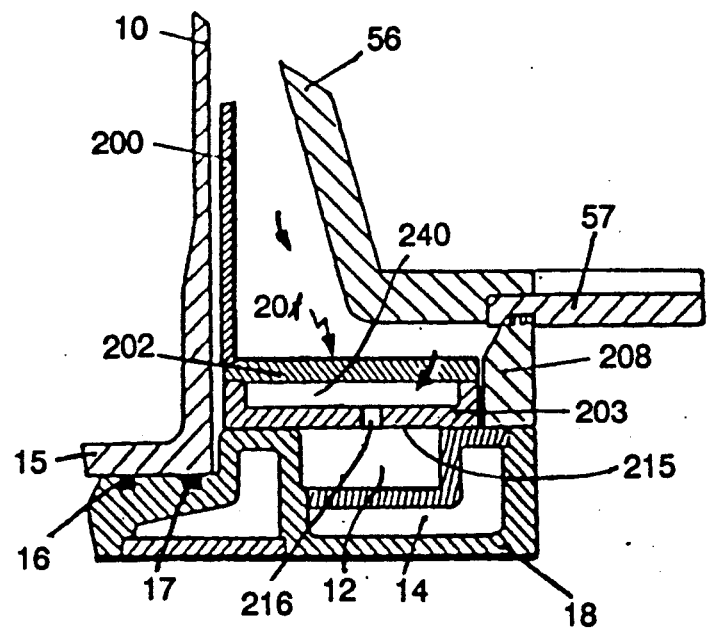
FIG. 4 is a sectional view of the pedestal area of the wafer support of FIG. 1.

FIG. 4 shows a cutaway view of the floor structure of the reaction chamber 10. The latter comprises a flange projection 15 at its lower end. In FIG. 4 the profiled floor structure of the reaction chamber 10 is situated in a position applied against the underside of the flange projection 15, and a tight connection is ensured by two O-rings 16 and 17. The position of the floor structure in FIG. 4 corresponds to the working position of the wafer support 50 within the reaction chamber 10. For the transfer of the wafer support 50 to the charging zone, all of the parts shown within the reaction chamber 10 of FIG. 4 can be shifted into the charging zone by means of the lift 160 (FIG. 1).

A quartz ring insert 200 is placed between the support pedestal 56 and the inner wall of the reaction chamber 10, substantially directly adjacent to the chamber wall. This ring insert 200 sits tightly on the upper rim area of an annular chamber 201 which is superimposed on the chamber gas outlet 12. The annular chamber 201 is intended to collect and retain foreign particles accumulated in the area between the ring insert 200 and the pedestal 56. For this purpose, both the annular ceiling plate 202 and the floor piece 203, having in cross-section a U profile, of the chamber 201 are provided with inlet and/or outlet openings for the gas and particle streams. The inlets, as shown by the arrows in FIG. 4 indicating the flow, are preferably situated beneath the bottom of the pedestal.

For effective retention of particles inside the annular space 210, it is advantageous to insert a perforated intermediate ceiling between the floor and cover parts of the annular chamber 201, the perforations in the said intermediate ceiling being radially staggered with respect to the inlet openings in the cover part 202.

To cool the hot exhaust gases, a further annular channel 14 is formed beneath the annular outlet channel 12, conducting a cooling fluid, preferably water.

As a cooling measure, an annular heat shield 208 is placed between the annular chamber 201 and the support drive, not shown in FIG. 4, which is connected to the base plate 57 of the support pedestal 56.

Figure 5:
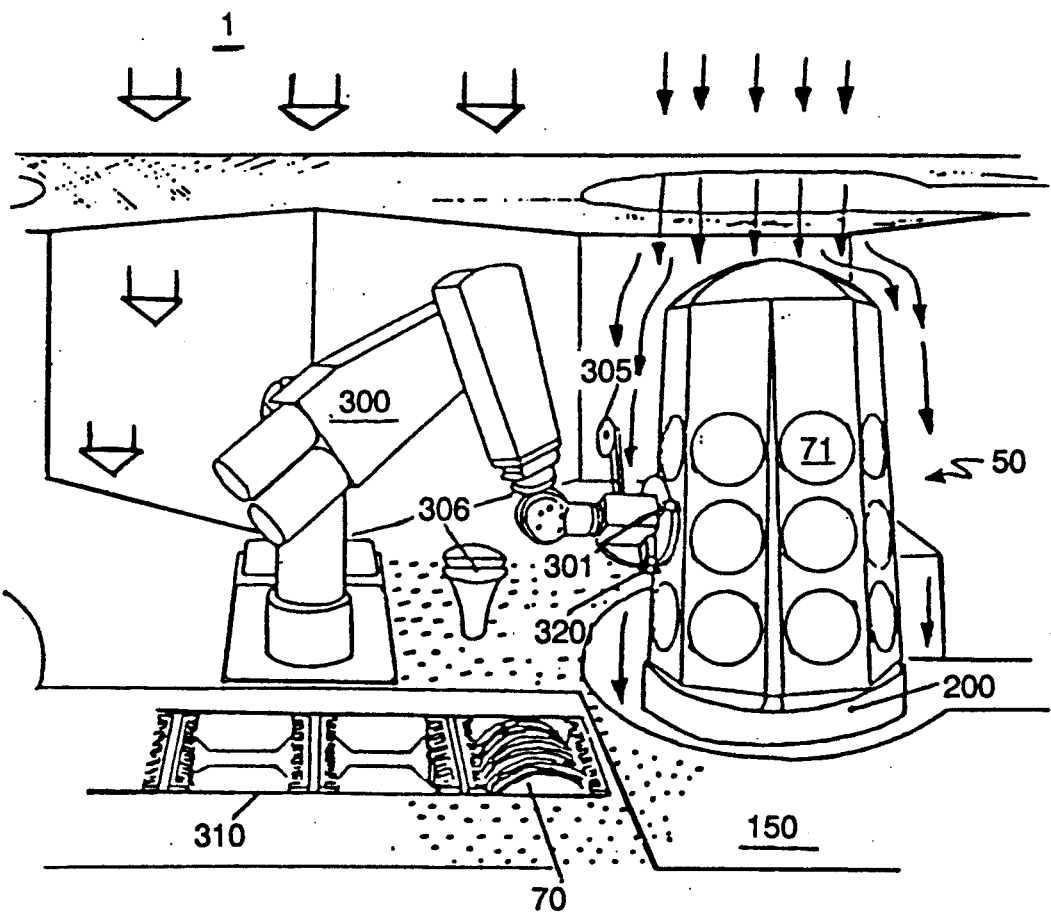
FIG. 5 is a view in perspective of a charging zone and a manipulator of the epitaxial facility of FIG. 2.

FIG. 5 shows the wafer support 50 after it has been transferred into the charging zone 150, where, with the help of a computer-controlled manipulator 300 in the form of a robot arm, it can be charged with wafers 70 or discharged.

The robot arm 300 is located in the clean-air space 1 between the charging zones of several, and for example two, wafer supports 50. In the case of two wafer supports to be charged, the second wafer support is located in a position which is not visible, to the left of the manipulator 300 in FIG. 5.

In FIG. 5, the pure air flow is represented by the fat arrows, and the protective gas flow provided in accordance with the invention, by the thin arrows. The protective gas stream surrounds the wafer support 50 when it is transferred into the charging zone 150 and back into its working position within the reaction chamber 10. It is clear here that both flows run parallel to one another and vertically from top to bottom.

According to FIG. 5, the robot arm 300 is designed to swivel with its grabbing device in such a way that it has access both to the wafer storage bin 310 located in the foreground in FIG. 5 and to a vertical row of indentations 71. By appropriate rotation of the support 50 by means of the drive mechanism provided for that purpose, the vertical rows of indentations 71 can be brought in step-by-step succession to a favorable charging and discharging position for the robot arm 300. The grabbing device consists substantially of two independent grabbing members, namely a pair of fingers 301 and a suction cup 305. Only one of the two fingers 301 is visible in FIG. 5.

Located approximately halfway between the stationary base of the robot arm 300 and the charging zone 150 is a platform 306, on which the wafers 70 are set down before being placed in the indentations 71 of the support 50 or in the recesses provided for them in the wafer storage bin 310. The platform is used by the robot arm as a relay station in which it momentarily deposits the wafer in order to use the grabbing member appropriate in each case to transfer it to its final position either on the wafer support 50 or in the wafer storage bin 310.

For transfer from the wafer storage bin 310 to the platform 306 or vice versa, the grabbing member in the form of a suction cup 305 is used. With it the wafer 70 is grasped on its side opposite the coating side and placed back in the bin or is taken out of the bin and placed on the platform 306 with the side to be coated facing up.

The still uncoated wafer 70 positioned on the platform 306 is picked up by its edges by the second grabbing member comprising the two fingers 301 and transferred to the specified indentation 71 in the wafer support 50. A coated wafer 70, on the contrary, is taken out of the corresponding indentation 71 frontally by the two-finger member 301 and put down with the uncoated back side on the platform 306.

Figure 6:
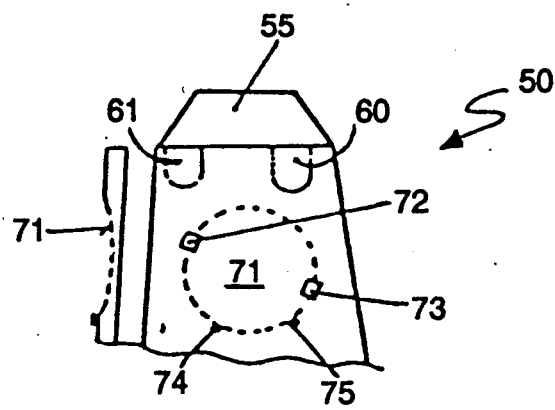
FIG. 6 is a schematic view of an indentation for accommodating a wafer on the wafer support.
Figure 7:
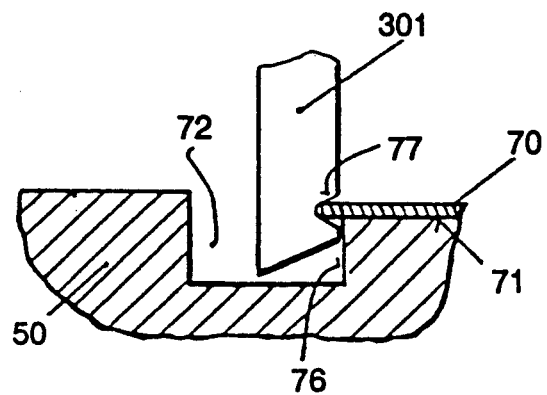
FIG. 7 is a sectional view of the rim area of the indentation in FIG. 6, charged with a wafer.

As can be seen from the detailed views in FIGS. 6 and 7, the indentations 71 on the lateral surface of the wafer support 50 are made substantially spherically curved and comprise in their rim area two diagonally opposed recesses 72 and 73. A partial section through the indentation 71 in the area of one of the recesses 72 is shown in FIG. 7. It can be seen that the distance between the inner edges 76 of the recesses 72 and 73 is slightly smaller than the wafer diameter, so that in the area of the recesses 72 and 73 the wafer projects into them. In the area of the tips of the fingers there is formed a wedge-shaped notch 77 dimensioned in such a way that the two fingers 301 and 302 can hook around the wafer rim in the area of the recesses 72 and 73 without running up against the inner edges of the recesses 72 and 73. In this way, the wafer can be grasped on the rim with the two diagonally opposed grabbing fingers and placed in the indentations 71 or taken out of them.

Wafers are designed essentially circular in shape and comprise a rectilinear edge section for marking purposes. Now, in order to be able to effect the insertion of a wafer 70 in the indentation 71 provided for that purpose with the help of the recesses 72 and 73 provided on its margins and the two grabbing fingers 301 and 302, it is imperative that the wafer 70 be grasped at two points, each located on the circular rim of the wafer. To recognize the edge of the wafer, the grabbing member provided with the two fingers comprises an optical detector 320. The grasping of the wafer 70 on its rim, controlled by the optical detector 320, by the two grabbing fingers takes place preferably in such a way that the detector 320 orients itself to the rectilinear edge section of the wafer and then consistently brings the two fingers 301 and 302 to a predetermined position, which is always the same, on the rectilinear edge section. This guarantees that during the coating of the wafer the reaction gases always flow in the same specified direction with respect to the surface of the wafer.

As can be seen in the sectional view of the indentation 71 in the left part of FIG. 6, the spherical contour of this indentation extends to the lateral surface of the wafer support 50, with which the indentation essentially merges continuously. This ensures even heat distribution within the indentation 71 when the wafer support 50 and wafers 70 are heated up. To prevent the wafer 70 from slipping out of an indentation 71 designed in this manner, two support points 74 and 75 are provided at a distance from one another in the area of the lower rim of the indentation.

When the rim of the wafer is grasped punctually in two places by the fingers 301, 302 of the manipulator 300, care must be taken lest these two points on the edge of the wafer coincide with a crystallographic axis. Stresses running along such a crystal axis readily lead to crack formation and, as a result, to destruction of the wafer 30. For this reason, the axis uniting the two recesses 72 and 73 must be placed in such a way that, depending on the particular type of wafer being used and its desired positioning in the indentation 71, they do not coincide with a crystalline privileged direction. Ordinarily the wafer 70 is positioned in the indentation 71 in such a way that its rectilinear edge section is in the uppermost position.

Figure 8:
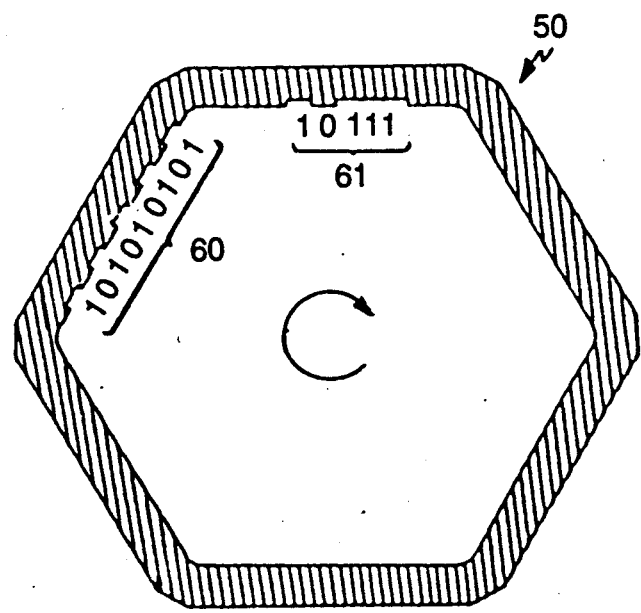
FIG. 8 is a horizontal section through the upper area of a wafer support.

FIG. 8 elucidates the principle applied in accordance with the invention for recognition of a wafer support 50 immediately before the beginning of an epitaxial process or during such process. This principle is based on differing degrees of emission of thermal radiation as a function of the wall thickness of a heat-radiating body. Accordingly, a code 60 is provided at a specified location on the wafer support 50, preferably in the area of the upper edge of the support. This support code 60 comprises wall segments of different thicknesses placed at a distance from one another, preferably arranged along a line at the same height on the wafer support, approximately in the manner of a line or bar code. In the embodiment of the code 60 represented by way of example, this code consists of linearly disposed thin places in the area of the inner wall of the wafer support 50, to which a logical 1 is assigned during evaluation in the process control computer connected downstream, after detection by the pyrometer 400 (FIG. 1). In the present embodiment example, therefore, the code consists of a succession of wall thicknesses each interrupted by an unthinned wall position, corresponding to the succession of a logical 1 and a logical 0.

Instead of thinned places, thickened areas of material on the support wall are also suitable for the support code.

In addition to the support code 60 containing information concerning the nature of the support, in the neighborhood of this code there must also be information which initializes the detector with a view to the evaluation of the support code. In the exemplary embodiment of the code in FIG. 8 this consists of a wall code 61 comprising additional thinned areas provided on a section of the wall of the wafer support 50 which, in the direction of rotation of the wafer support 50, here shown as clockwise, is placed before the actual support code 60.

Figure 9:
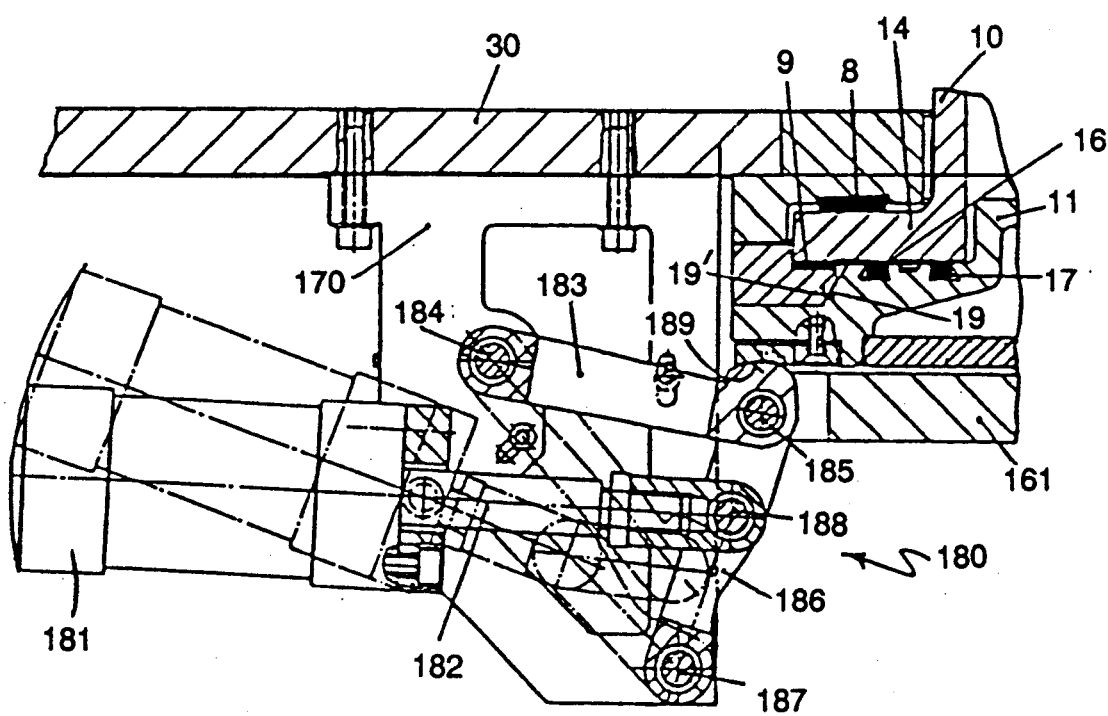
FIG. 9 is a coupling device for the floor structure of the reaction chamber of FIG. 1.

FIG. 9 shows a coupling device 180 designed for tilt-free coupling of the floor structure 11 of the reaction chamber to the base flange 15 of the said chamber.

As already described, the floor structure 11 together with the wafer support 50 positioned on that structure is transferred by means of a vertical lift 160 with a lifting platform 161 from the charging zone 150 to an elevated position in which the floor structure 11 must finally be tightly coupled to the connecting surface of the base flange 15 of the reaction chamber 10. A tightly sealed connection of the floor structure 11 with the flange 15 is provided by O-rings 16 and 17, which fit into circular recesses in the floor structure 11. The flange 14 is set into an annular recess in a supporting plate 30. Elastomer rings 8 and 9 are inserted between the contact surfaces of the flange 15 and the inner wall of the annular recess. The elastomer rings 8 and 9 protect the pressure-sensitive quartz material, of which the flange 15 is made, just like the rest of the wall of the reaction chamber 10, against damage.

For tight coupling of the floor structure 11 to the lower connecting surface of the flange 15, the floor structure is raised by means of the vertical lift 160 to the area of the flange 15. The lifting movement of the platform 161 of the lift is stopped as soon as the connecting surface of the floor structure 11, located opposite the underside of the flange and fitted with O-rings 16 and 17, has been raised to the level of the lower edge of a bevelled surface 19' formed in the supporting plate 30 below the recess to accommodate the flange 15. The bevelled edge is ring-shaped in the form of a segment of a cone, tapering in the direction of the flange 15. In order for the floor structure 11 to fit snugly with the bevelled surface 19' of the supporting plate 30, the rim area of the floor structure 11 which is connected to the connecting surface with O-rings 16 and 17 is also designed as an annular bevelled surface. With this bevelled surface 19 the floor structure 11 is guided so that it slides along the bevelled surface 19' of the supporting plate 30 as soon as the coupling device 180 grasps the floor structure 11 from below and raises it.

The coupling device 180 consists of a number of lever mechanisms pivot-mounted peripherally at a distance from one another on a supporting section 117 in the area of the circular chamber flange 15, the supporting section being fixed to the underside of the plate. In the embodiment shown by way of example, the coupling device 180 comprises three lever mechanisms angularly spaced 120° from one another.

Each lever mechanism comprises two levers 183 and 186. The first lever 183 is mounted at one end so as to swivel on a pivot 184 set into the supporting section 170. The other end of the first lever 183 is connected by means of a pivot 185 to the second lever 186, the other extremity of which is mounted on a pivot 187 fixed in the supporting section 170. Both levers are actuated by means of the piston 182 of an actuating mechanism 181 mounted on the supporting section 170. Approximately midway between the pivot pins 185 and 187, a further pivot 188 is provided on the second lever 186, constituting a swivel mount for the piston 182.

In FIG. 9 the coupling end position of the two levers 183 and 186 is represented by solid lines and the uncoupling position of the said levers is represented by dot-and-dash lines. In the uncoupling position the piston 182 is in its position of retraction into the actuating mechanism 181, in which this mechanism is simultaneously swung aside in such a way that the two levers 183 and 186 clear the lifting area for the swinging platform 161. As soon as the lifting platform 161 takes up its raised position, the levers 183 and 186 are shifted over into their coupling position by the actuating mechanism 181. In this position a cam surface 189 formed on the first lever 183 in the area of the connecting pivot 185 engages with an area complementary to the said cam surface formed on the underside of the floor structure 11, while the second lever 186 substantially carries the supporting load. The cam surface 189 and the area cooperating with it, formed on the floor structure 11, cooperate with the arrangement of the two levers 183 and 186 in such a way that, as the stroke of the actuating piston 182 increases, the floor structure 11, guided by the bevelled surfaces 19 and 19', is moved upward in the exactly vertical direction into a seal-forming position with the flange 15.

The embodiments of the invention in which an exclusive property or privilege is claimed are defined as follows:

1. An epitaxial facility for the deposition of an epitaxial layer on a plurality of semiconductor wafers comprising:
    an elongated chamber having a longitudinal axis and opposing first and second end walls;
    at least one gas inlet defined in said first end wall for admission of a gas into said chamber and at least one gas outlet defined in said second end wall for discharge of said gas from said chamber, said gas inlet and said gas outlet defining a gas flow direction substantially parallel to said longitudinal axis;
    a wafer support having an axis of symmetry parallel to said gas flow direction disposed in said chamber for holding wafers, said support having a cross section in the general form of a polygon with rounded corners, said support comprising a truncated pyramid having an apical end and basal end, said basal end tapering outwardly toward said second end wall, and said support further comprising a second truncated pyramid having an apical end and a basal end, the basal end of said first truncated pyramid lying adjacent the basal end of said second truncated pyramid and being of corresponding same size and shape;
    a cap disposed on the end of said support adjacent said gas inlet, said cap defining an outer surface of contour adapted to promote laminar flow generally along the surface of said support; and
    lining means connected to said second end wall and extending in a region adjacent said second end wall for receiving and retaining a portion of contaminants contained within said laminar flow of gas.

2. An epitaxial facility for the deposition of an epitaxial layer on a plurality of semiconductor wafers comprising:
    an elongated chamber having a longitudinal axis and opposing first and second end walls;
    at least one gas inlet defined in said first end wall for admission of a gas into said chamber and at least one gas outlet defined in said second end wall for discharge of said gas from said chamber, said gas inlet and said gas outlet defining a gas flow direction substantially parallel to said longitudinal axis;
    a wafer support having an axis of symmetry parallel to said gas flow direction disposed in said chamber for holding wafers, said support having a cross section in the general form of a polygon with rounded corners, said wafer support being connected to said second end wall;
    a cap disposed on the end of said support adjacent said gas inlet, said cap defining an outer surface of contour adapted to promote laminar flow generally along the surface of said support; and
    lining means connected to said second end wall and extending in a region adjacent said second end wall for receiving and retaining a portion of contaminants contained within said laminar flow of gas, said lining means comprising a cylindrical insert disposed in said region and aligned coaxially with said chamber, said gas outlet being defined in the area of said second end wall encompassed by said cylindrical insert, said second end wall, said lining means and said support being removable as a unit from said elongated chamber.

3. An epitaxial facility for the deposition of an epitaxial layer on a plurality of semiconductor wafers comprising:
    an elongated chamber having a longitudinal axis and opposing first and second end walls;
    at least one gas inlet defined in said first end wall for admission of a gas into said chamber and at least one gas outlet defined in said second end wall for discharge of said gas from said chamber, said gas inlet and said gas outlet defining a gas flow direction substantially parallel to said longitudinal axis;
    a wafer support having an axis of symmetry parallel to said gas flow direction disposed in said chamber for holding wafers, said support having a cross section in the general form of a polygon with rounded corners, said wafer support being connected to said second end wall, and second end wall, said lining means and said support being removable as a unit from said elongated chamber, said second end wall comprising in order of said gas flow direction: a perforated end plate designed to allow gas to flow through; wall means defining, with a base member and said perforated end plate, a particle trap space; and vacuum means for removing gas from said particle trap;
    a cap disposed on the end of said support adjacent said gas inlet, said cap defining an outer surface of contour adapted to promote laminar flow generally along the surface of said support; and
    lining means connected to said second end wall and extending in a region adjacent said second end wall for receiving and retaining a portion of contaminants contained within said laminar flow of gas, said lining means comprising a cylindrical insert disposed in said region and aligned coaxially with said chamber, said gas outlet being defined in the area of said second end wall encompassed by said cylindrical insert.

4. The epitaxial facility of claim 3 wherein said vacuum means comprises:
 a U-shaped channel defining, with said base member, a vacuum space for removing gas from said particle trap space; and
 a pump means attached to said U-shaped channel for providing a vacuum within said vacuum space.

5. The epitaxial facility of claim 4 wherein said second end wall further comprises a support plate shaped to provide:
 a cooling channel for cooling gases passing through said vacuum space; and
 a flange adapted to mate with a corresponding surface on the wall of said elongated chamber.

6. An epitaxial facility for the deposition of an epitaxial layer on a plurality of semiconductor wafers comprising:
 an elongated chamber having opposing first and second end walls;
 a gas inlet defined in said first end wall for admitting a gas, and a gas outlet defined in said second end wall;
 a wafer support for holding wafers,
 a support code formed on the wafer support for identifying said wafer support; and
 in a region adjacent said second end wall, lining means for receiving and retaining a portion of contaminants contained within said gas.

7. The epitaxial facility of claim 6 further comprising a decoding device adapted to read and interpret said support code on said wafer support.

8. The epitaxial facility of claim 7 wherein said decoding device is adapted to start gas flow in said chamber in response to said support code on said wafer support.

9. The epitaxial facility of claim 7 further comprising a computer adapted to control the epitaxial deposition process, said computer including memory means for receiving and storing said support code from said decoding device.

10. The epitaxial facility of claim 7 wherein said support code comprises binary code represented by a variable thickness wall of the wafer support.

11. The epitaxial facility of claim 10 wherein said decoding device is a pyrometer, said pyrometer adapted to measure the thermal absorption of said variable thickness wall of the wafer support.

12. An epitaxial facility for transferring wafers to and from a wafer support, comprising:
 a gas inlet and a gas outlet arranged to promote laminar gas flow in a gas flow direction, said laminar gas flow defining a clean air space;
 a wafer bin located in said clean air space for storing said wafers;
 a wafer support disposed in said clean air space, said wafer support having an axis of symmetry parallel to said gas flow direction for holding said wafers, said support having a cross section in the general form of a polygon with rounded corners;
 a cap disposed on the end of said support adjacent said gas inlet, said cap defining an outer surface of contour adapted to promote laminar flow generally along the surface of said support in a manner to prevent contaminants from interacting with wafer surfaces; and
 a remote controlled manipulator for transferring said wafers between said wafer bin and said wafer support, said remote controlled manipulator adapted to move in a direction substantially parallel to said gas flow in said clean air space;
 wherein said remote controlled manipulator is surrounded by a flexible dust protection jacket.

13. The epitaxial facility of claim 12 wherein said remote controlled manipulator is a robot arm controlled by a process control computer.

14. The epitaxial facility of claim 13 further comprising a wafer having the form of a circular substrate having a front side and a back side and a pair of diametrically opposed, substantially circular indentations defined on the edge of said wafer on the back side of said wafer.

15. The epitaxial facility of claim 14 wherein said remote controlled manipulator comprises:
 a robot arm having a distal end;
 a grabbing member disposed on said distal end of said robot arm having opposed finger members, said finger members having outer end portions sized and adapted to fit into said indentations and hold the edge of said wafer, said grabbing member being rotatably adjustable about an axis, said opposing fingers being adjustable relative to said axis; and
 an optical detector disposed on said grabbing member for detecting an alignment mark on the edge of a wafer.

16. The epitaxial facility of claim 15 wherein said grabbing member further comprises suction means adapted to hold a wafer on said back side.

17. An epitaxial facility for the deposition of an epitaxial layer on a plurality of semiconductor wafers comprising:
 side walls defining an elongated chamber;
 opposing first and second end walls at opposite ends of said elongated chamber, said second end wall including a sealing flange and a bevelled guiding surface, said sealing flange adapted to mate with a corresponding side wall surface at an end of said elongated chamber;
 at least three lever mechanisms for providing upwardly directed force to mate and seal said flange with said corresponding surface of said elongated chamber, said lever mechanisms located at equally spaced positions around the perimeter of said sealing flange;
 a gas inlet defined in said first end wall for admitting a gas, and a gas outlet defined in said second end wall;
 a wafer support attached to said second end wall for holding wafers;
 means connected to second end wall for receiving and retaining a substantial portion of contaminants contained within said gas; and
 a transfer unit adapted to remove said wafer support, said second end wall, and said lining means together as a unit from said elongated chamber.

* * * * *